(12) United States Patent
Sun et al.

(10) Patent No.: US 12,310,212 B2
(45) Date of Patent: May 20, 2025

(54) DISPLAY SUBSTRATE, DISPLAY PANEL AND IMAGE DISPLAY METHOD

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Yan Sun, Beijing (CN); Xiaomang Zhang, Beijing (CN); Tiankuo Shi, Beijing (CN); Wei Sun, Beijing (CN); Xiaochuan Chen, Beijing (CN); Zhijian Zhu, Beijing (CN); Pengcheng Lu, Beijing (CN); Chenyu Chen, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 512 days.

(21) Appl. No.: 17/636,616

(22) PCT Filed: Mar. 19, 2021

(86) PCT No.: PCT/CN2021/081813
§ 371 (c)(1),
(2) Date: Feb. 18, 2022

(87) PCT Pub. No.: WO2022/193291
PCT Pub. Date: Sep. 22, 2022

(65) Prior Publication Data
US 2023/0354667 A1    Nov. 2, 2023

(51) Int. Cl.
*H10K 59/35*     (2023.01)
*G09G 3/3208*    (2016.01)
(Continued)

(52) U.S. Cl.
CPC ......... *H10K 59/353* (2023.02); *G09G 3/3208* (2013.01); *H10K 59/351* (2023.02);
(Continued)

(58) Field of Classification Search
CPC ...... H10K 59/35; H10K 59/80; H10K 59/351; H10K 59/353; H10K 77/10; H10K 59/00;
(Continued)

(56) References Cited

U.S. PATENT DOCUMENTS

2005/0225575 A1   10/2005   Brown et al.
2015/0301239 A1   10/2015   Xi et al.
(Continued)

FOREIGN PATENT DOCUMENTS

CN    104091527 A    10/2014
CN    111667763 A    9/2020

OTHER PUBLICATIONS

EP Communication pursuant to Rules 70(2) and 70a(2) for EP application No. 21930883.0 mailed Jun. 5, 2023, 1 page.
(Continued)

*Primary Examiner* — Chuong A Luu
(74) *Attorney, Agent, or Firm* — Myers Bigel, P.A.

(57) ABSTRACT

A display substrate including a base substrate is provided. The display substrate includes a sub-pixel array, which includes a plurality of first sub-pixel rows and a plurality of second sub-pixel rows, each first sub-pixel row includes a plurality of first sub-pixels, a plurality of second sub-pixels, and a plurality of third sub-pixels, each second sub-pixel row includes a plurality of fourth sub-pixels and a plurality of white sub-pixels. Each first sub-pixel, each second sub-pixel, and each third sub-pixel are configured such that white can be displayed by combining a single first sub-pixel, a single second sub-pixel, and a single third sub-pixel, and each fourth sub-pixel is selected from any one of the first
(Continued)

sub-pixel, the second sub-pixel and the third sub-pixel. Each of the plurality of first sub-pixel rows and each of the plurality of second sub-pixel rows are arranged alternately in a column direction of the sub-pixel array.

20 Claims, 9 Drawing Sheets

(52) U.S. Cl.
 CPC ............... *G09G 2320/0233* (2013.01); *G09G 2320/0271* (2013.01)
(58) Field of Classification Search
 CPC ........ H10K 59/12; H10K 59/38; H10K 59/60; H10K 59/65; H10K 59/121; H10K 59/128; H10K 59/131; H10K 59/179; H10K 59/352; H10K 59/122; H10K 59/1201; H10K 59/8723; H10K 71/00; H10K 71/166; G09G 3/20; G09G 3/3208; G09G 2300/0452; G09G 2320/0233; G09G 2320/0271
 USPC ............................................................ 257/40
 See application file for complete search history.

(56) References Cited

U.S. PATENT DOCUMENTS

2017/0116940 A1* 4/2017 Wang ................... G09G 3/3648
2020/0212125 A1* 7/2020 Liu ...................... H10K 59/352

OTHER PUBLICATIONS

Extended European Search Report for EP21930883.0 mailed May 16, 2023, 8 pages.

* cited by examiner

| G | R | B | G | R | B |
|---|---|---|---|---|---|
| B | W | W | B | W | W |
| G | R | B | G | R | B |
| B | W | W | B | W | W |
| G | R | B | G | R | B |
| B | W | W | B | W | W |
| G | R | B | G | R | B |
| B | W | W | B | W | W |

| R | G | B | R | G | B | R | G | B | R | G | B |
|---|---|---|---|---|---|---|---|---|---|---|---|
| R | G | B | R | G | B | R | G | B | R | G | B |
| R | G | B | R | G | B | R | G | B | R | G | B |
| R | G | B | R | G | B | R | G | B | R | G | B |
Fig. 9
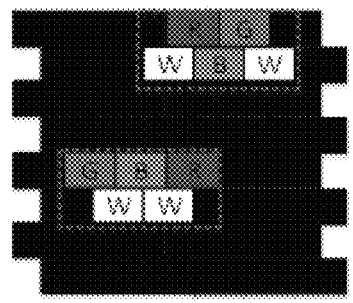
Fig.10
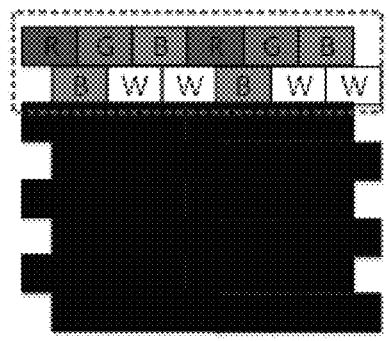
Fig.11

US 12,310,212 B2

DISPLAY SUBSTRATE, DISPLAY PANEL AND IMAGE DISPLAY METHOD

RELATED APPLICATION

The present application is a 35 U.S.C. 371 national stage application of a PCT International Application No. PCT/CN2021/081813 filed on Mar. 19, 2021.

TECHNICAL FIELD

The present disclosure relates to the field of display technologies, particularly to a display substrate, a display panel comprising the display substrate, and an image display method based on the display panel.

BACKGROUND

In recent years, electronic display products have been widely popularized in people's daily life and industrial production. Different types of display devices based on different technologies have been effectively developed and applied, and accordingly, people have increasingly high requirements on the image display quality of display devices. For existing display products, technicians mostly try to improve the image display quality from the perspective of improving the control method for displaying images. However, in practice, customer satisfaction with the quality and performance of display products still needs to be improved.

SUMMARY

An embodiment of the present disclosure provides a display substrate. The display substrate comprises a base substrate, a display region of the base substrate comprises a sub-pixel array, the sub-pixel array comprises a plurality of first sub-pixel rows and a plurality of second sub-pixel rows, each first sub-pixel row of the plurality of first sub-pixel rows comprises a plurality of first sub-pixels, a plurality of second sub-pixels, and a plurality of third sub-pixels, each second sub-pixel row of the plurality of second sub-pixel rows comprises a plurality of fourth sub-pixels and a plurality of white sub-pixels. Each of the plurality of first sub-pixels, each of the plurality of second sub-pixels, and each of the plurality of third sub-pixels are configured such that white can be displayed by combining a single first sub-pixel, a single second sub-pixel, and a single third sub-pixel, and each of the plurality of fourth sub-pixels is selected from any one of the first sub-pixel, the second sub-pixel, and the third sub-pixel. Each of the plurality of first sub-pixel rows and each of the plurality of second sub-pixel rows are arranged alternately in a column direction of the sub-pixel array to form the sub-pixel array.

According to some embodiments of the present disclosure, each first sub-pixel row of the plurality of first sub-pixel rows comprises a plurality of first sub-pixel units, each first sub-pixel unit comprises one first sub-pixel, one second sub-pixel and one third sub-pixel, and first sub-pixel units of the plurality of first sub-pixel units are arranged successively in a row direction of the sub-pixel array to form one first sub-pixel row; each second sub-pixel row of the plurality of second sub-pixel rows comprises a plurality of second sub-pixel units, each second sub-pixel unit comprises one fourth sub-pixel and at least one white sub-pixel, and second sub-pixel units of the plurality of second sub-pixel units are arranged successively in the row direction of the sub-pixel array to form one second sub-pixel row.

According to some embodiments of the present disclosure, any first sub-pixel row of the plurality of first sub-pixel rows and a second sub-pixel row adjacent to the any first sub-pixel row are offset from each other by a predetermined distance in the column direction of the sub-pixel array, wherein the predetermined distance is greater than zero and less than a width of the first sub-pixel, the second sub-pixel, or the third sub-pixel in a row direction.

According to some embodiments of the present disclosure, the predetermined distance is half of the width of the first sub-pixel, the second sub-pixel, or the third sub-pixel in the row direction.

According to some embodiments of the present disclosure, the first sub-pixel, the second sub-pixel, the third sub-pixel, and the white sub-pixel all present a hexagonal shape.

According to some embodiments of the present disclosure, a width of any sub-pixel of the first sub-pixel, the second sub-pixel, the third sub-pixel, and the white sub-pixel in a row direction of the sub-pixel array is greater than or equal to a height of the any sub-pixel in the column direction of the sub-pixel array.

According to some embodiments of the present disclosure, a sum of a row number of the plurality of first sub-pixel rows and a row number of the plurality of second sub-pixel rows in the sub-pixel array is greater than a sum of numbers of all first sub-pixels, second sub-pixels, and third sub-pixels in each first sub-pixel row or a sum of numbers of all fourth sub-pixels and white sub-pixels in each second sub-pixel row.

According to some embodiments of the present disclosure, an area of the white sub-pixel is smaller than an area of any one of the first sub-pixel, the second sub-pixel, and the third sub-pixel.

According to some embodiments of the present disclosure, each second sub-pixel unit in the second sub-pixel row comprises one fourth sub-pixel and one white sub-pixel, and a width of the white sub-pixel in the row direction of the sub-pixel array is greater than a width of the fourth sub-pixel in the row direction of the sub-pixel array.

According to some embodiments of the present disclosure, the first sub-pixel, the second sub-pixel and the third sub-pixel comprise an R sub-pixel, a G sub-pixel and a B sub-pixel, respectively, such that the plurality of first sub-pixel rows form a plurality of RGB sub-pixel rows, and the fourth sub-pixel comprises a B sub-pixel such that the plurality of second sub-pixel rows form a plurality of BW sub-pixel rows.

According to some embodiments of the present disclosure, each B sub-pixel in any RGB sub-pixel row of the plurality of RGB sub-pixel rows is contiguous to at least one white sub-pixel in a BW sub-pixel row adjacent to the any RGB sub-pixel row, and each B sub-pixel in the adjacent BW sub-pixel row is contiguous to at least one of the R sub-pixel and the G sub-pixel in the any RGB sub-pixel row.

According to some embodiments of the present disclosure, each BW sub-pixel row of the plurality of BW sub-pixel rows comprises a plurality of second sub-pixel units arranged successively in the row direction of the sub-pixel array, each second sub-pixel unit comprises one B sub-pixel and two white sub-pixels, wherein one of the two white sub-pixels is between the one B sub-pixel and the other of the two white sub-pixels.

According to some embodiments of the present disclosure, a spacing between the two white sub-pixels is greater than a spacing between any two sub-pixels of the R sub-pixel, the B sub-pixel, the G sub-pixel, and the white sub-pixel.

According to some embodiments of the present disclosure, each RGB sub-pixel row of the plurality of RGB sub-pixel rows comprises a plurality of first sub-pixel units arranged successively in the row direction of the sub-pixel array, each first sub-pixel unit comprises one R sub-pixel, one G sub-pixel and one B sub-pixel, wherein the R sub-pixel, the G sub-pixel, and the B sub-pixel in the first sub-pixel unit are arranged successively in an RGB or a GRB order in the row direction of the sub-pixel array.

According to some embodiments of the present disclosure, each RGB sub-pixel row of the plurality of RGB sub-pixel rows comprises a plurality of first sub-pixel units arranged successively in the row direction of the sub-pixel array, each first sub-pixel unit comprises one R sub-pixel, one G sub-pixel and one B sub-pixel, wherein the R sub-pixel, the G sub-pixel and the B sub-pixel in the first sub-pixel unit in a K-th RGB sub-pixel row of the plurality of RGB sub-pixel rows are arranged successively in an RGB order in the row direction of the sub-pixel array, and the R sub-pixel, the G sub-pixel and the B sub-pixel in the first sub-pixel unit in a (K+1)-th RGB sub-pixel row of the plurality of RGB sub-pixel rows are arranged successively in a GRB order in the row direction of the sub-pixel array, K being an integer greater than or equal to 1.

According to some embodiments of the present disclosure, the display substrate comprises a color resist layer attached to the base substrate, the color resist layer comprises a color resist unit array, and colors of color resist units in the color resist unit array are in one-to-one correspondence with sub-pixels in the sub-pixel array.

According to some embodiments of the present disclosure, the display substrate further comprises an electroluminescent material in each sub-pixel of the sub-pixel array, the electroluminescent material is configured to emit light of a color corresponding to the sub-pixel where it is located under the effect of an electrical signal.

Another embodiment of the present disclosure provides a display panel, and the display panel may comprise the display substrate described in any one of the foregoing embodiments.

A further embodiment of the present disclosure provides a method of displaying an image based on the display panel described in the foregoing embodiment, the method comprising: acquiring original grayscale values of a first primary color component, a second primary color component, and a third primary color component of each original image pixel of an original image in a three primary color space; generating a first color component grayscale value, a second color component grayscale value, a third color component grayscale value, and a white component grayscale value corresponding to each original image pixel based on the original grayscale values of each original image pixel of the original image, so as to obtain a plurality of four-color image pixels corresponding to the image pixels of the original image respectively;

dividing the sub-pixel array of the display panel into a plurality of first sub-pixel groups and a plurality of second sub-pixel groups, each first sub-pixel group comprising one first sub-pixel, one second sub-pixel and one fourth sub-pixel contiguous to each other in a first sub-pixel row and a second sub-pixel row adjacent to each other in the sub-pixel array, each second sub-pixel group comprising one third sub-pixel and at least one white sub-pixel contiguous to each other in the first sub-pixel row and the second sub-pixel row adjacent to each other in the sub-pixel array; making first sub-pixel groups and second sub-pixel groups in the sub-pixel array in one-to-one correspondence with four-color image pixels of the plurality of four-color image pixels, respectively, so as to obtain a first four-color image pixel corresponding to each first sub-pixel group and a second four-color image pixel corresponding to each second sub-pixel group; generating a grayscale value for a fourth sub-pixel in a first sub-pixel group corresponding to the first four-color image pixel based on a third color component grayscale value in the first four-color image pixel, generating a grayscale value for a third sub-pixel in a second sub-pixel group corresponding to the second four-color image pixel based on a third color component grayscale value in the second four-color image pixel;

generating a grayscale value for a first sub-pixel in the first sub-pixel group based on a first color component grayscale value in a first four-color image pixel corresponding to the first sub-pixel group and a first color component grayscale value in a second four-color image pixel corresponding to a second sub-pixel group adjacent to the first sub-pixel in the first sub-pixel group; generating a grayscale value for a second sub-pixel in the first sub-pixel group based on a second color component grayscale value in a first four-color image pixel corresponding to the first sub-pixel group and a second color component grayscale value in a second four-color image pixel corresponding to a second sub-pixel group adjacent to the second sub-pixel in the first sub-pixel group; and generating a grayscale value for a white sub-pixel in the second sub-pixel group based on a white component grayscale value in a second four-color image pixel corresponding to the second sub-pixel group and a white component grayscale value in a first four-color image pixel corresponding to a first sub-pixel group adjacent to the second sub-pixel group.

According to some embodiments of the present disclosure, the first sub-pixel, the second sub-pixel and the third sub-pixel comprise an R sub-pixel, a G sub-pixel and a B sub-pixel, respectively, such that the plurality of first sub-pixel rows form a plurality of RGB sub-pixel rows, the fourth sub-pixel comprises a B sub-pixel such that the plurality of second sub-pixel rows form a plurality of BW sub-pixel rows. The three primary color space comprises an RGB color space, the first primary color component, the second primary color component and the third primary color component comprise a red component, a green component and a blue component, respectively, the first color component grayscale value, the second color component grayscale value and the third color component grayscale value comprise a first red component grayscale value, a first green component grayscale value and a first blue component grayscale value, respectively, the four-color image pixel comprises an RGBW image pixel, and the first four-color image pixel and the second four-color image pixel comprise a first RGBW image pixel and a second RGBW image pixel, respectively. The third color component grayscale value in the first four-color image pixel comprises a first blue component grayscale value in the first RGBW image pixel, and the third color component grayscale value in the second four-color image pixel comprises a first blue component grayscale value in the second RGBW image pixel. The fourth sub-pixel in the first sub-pixel group and the third sub-pixel in the second sub-pixel group both comprise a B sub-pixel.

According to some embodiments of the present disclosure, the white component grayscale value is a minimum value among original grayscale values of a red component, a green component and a blue component of a respective image pixel of the original image, the first red component grayscale value, the first green component grayscale value, and the first blue component grayscale value are linear functions of the original grayscale values of a red component, a green component and a blue component of a respective image pixel of the original image, respectively.

According to some embodiments of the present disclosure, the first red component grayscale value, the first green component grayscale value, or the first blue component grayscale value is calculated based on the following formula:

$$GL_1 = A*GL - W_1$$

wherein $GL_1$ represents the first red component grayscale value, the first green component grayscale value or the first blue component grayscale value, $W_1$ represents the white component grayscale value, and GL represents an original grayscale value of a red component, a green component or a blue component of the respective image pixel of the original image, wherein $$A = \frac{M + W_1}{M},$$

where M represents a maximum value among the original grayscale values of a red component, a green component and a blue component of the respective image pixel of the original image.

According to some embodiments of the present disclosure, generating a grayscale value for a fourth sub-pixel in a first sub-pixel group corresponding to the first four-color image pixel based on a third color component grayscale value in the first four-color image pixel comprises: setting a grayscale value of a B sub-pixel in the first sub-pixel group corresponding to the first RGBW image pixel to be the first blue component grayscale value in the first RGBW image pixel; generating a grayscale value for a third sub-pixel in a second sub-pixel group corresponding to the second four-color image pixel based on a third color component grayscale value in the second four-color image pixel comprises: setting a grayscale value of a B sub-pixel in the second sub-pixel group corresponding to the second RGBW image pixel to be the first blue component grayscale value in the second RGBW image pixel.

According to some embodiments of the present disclosure, a grayscale value for an R sub-pixel in the first sub-pixel group and a grayscale value for a G sub-pixel in the first sub-pixel group are calculated based on any one of the following formulas:

$$f = 0.5a + 0.5b; \qquad f = \max(a, b);$$

$$f = \min(a, b); \qquad f = \frac{a}{a+b}*a + \frac{b}{a+b}*b,$$

wherein f represents the grayscale value for the R sub-pixel in the first sub-pixel group or the grayscale value for the G sub-pixel in the first sub-pixel group, a represents the first red component grayscale value in the first RGBW image pixel corresponding to the first sub-pixel group or the first green component grayscale value in the first RGBW image pixel corresponding to the first sub-pixel group, and b represents the first red component grayscale value in the second RGBW image pixel corresponding to the second sub-pixel group adjacent to the R sub-pixel in the first sub-pixel group or the first green component grayscale value in the second RGBW image pixel corresponding to the second sub-pixel group adjacent to the G sub-pixel in the first sub-pixel group.

According to some embodiments of the present disclosure, the method of displaying an image based on the display panel further comprises: turning off all white sub-pixels in the sub-pixel array in response to an intensity of ambient light where the display panel is located being greater than a light intensity threshold; and turning on all white sub-pixels in the sub-pixel array in response to the intensity of the ambient light being less than the light intensity threshold.

The technical solutions of some embodiments of the present disclosure are outlined above. It can be understood that different embodiments in the above embodiments and the technical features in the different embodiments can be combined with each other to form other new embodiments. These other new embodiments belong to part of the technical solutions claimed in the present disclosure. Moreover, the features and advantages of the technical solutions of some embodiments of the present disclosure outlined above can be better understood through specific examples described below in conjunction with the accompanying drawings.

BRIEF DESCRIPTION OF THE DRAWINGS

FIGS. 1 to 7 illustrate different examples of the sub-pixel array in a display substrate provided by an embodiment of the present disclosure, respectively;

FIGS. 8a and 8b illustrate sub-pixel repeating groups for the sub-pixel arrays shown in FIGS. 3 and 4, respectively;

FIG. 9 illustrates a sub-pixel array in a conventional OLED display device;

FIGS. 10, 11 and 12 illustrate views of a display panel comprising the sub-pixel array shown in FIG. 1 displaying white dots, white horizontal lines, and white vertical lines, respectively;

DETAILED DESCRIPTION OF EMBODIMENTS

Figure 3:
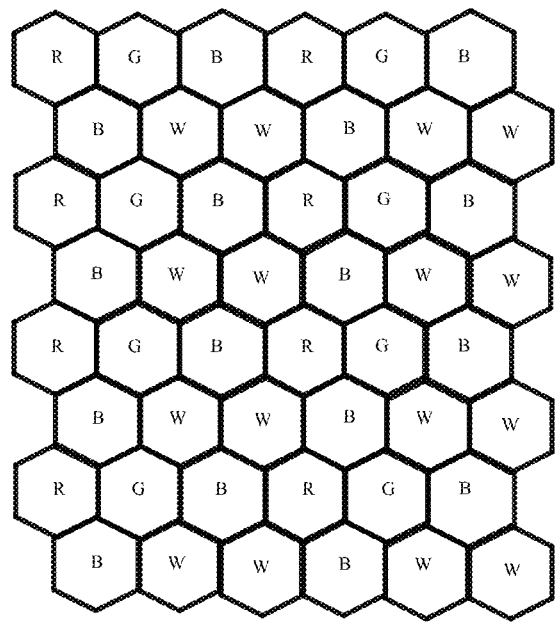

Some embodiments of the disclosure will be described in detail below through specific examples. It should be understood that the exemplary embodiments described below are only for explaining and clarifying the implementations of embodiments of the present disclosure. In particular, the sub-pixel arrays shown in the drawings do not represent the sub-pixels in an actual display product, but only illustrate the arrangement of sub-pixels in the sub-pixel array of a display product. Moreover, based on the embodiments described herein and the principles revealed by these embodiments, those skilled in the art can implement the technical solutions of the present disclosure in other different implementations, so as to obtain other embodiments that are different from the embodiments described herein. These other embodiments also fall within the protection scope of this patent application. Therefore, the exemplary embodiments described herein do not constitute a limitation on the scope of this patent application.

A display substrate provided by an embodiment of the disclosure comprises a base substrate. A display region of the base substrate comprises a sub-pixel array. The sub-pixel array comprises a plurality of first sub-pixel rows and a plurality of second sub-pixel rows. Each of the plurality of first sub-pixel rows includes a plurality of first sub-pixels, a plurality of second sub-pixels, and a plurality of third sub-pixels, and each of the plurality of second sub-pixel rows includes a plurality of fourth sub-pixels and a plurality of white sub-pixels (the white sub-pixels herein may also be referred to as W sub-pixels). Each of the plurality of first sub-pixels, each of the plurality of second sub-pixels, and each of the plurality of third sub-pixels are configured such that white can be displayed by combining a single first sub-pixel, a single second sub-pixel, and a single third sub-pixel, and each of the plurality of fourth sub-pixels is selected from any one of the first sub-pixel, the second sub-pixel, and the third sub-pixel. Each first sub-pixel row of the plurality of first sub-pixel rows and each second sub-pixel row of the plurality of second sub-pixel rows are arranged alternately in a column direction of the sub-pixel array to form the sub-pixel array.

It can be understood that the embodiment of the present disclosure does not limit the specific types of the first sub-pixel, the second sub-pixel, and the third sub-pixel, as long as a single first sub-pixel, a single second sub-pixel, and a single third sub-pixel can be combined to display white. For example, the first sub-pixel, the second sub-pixel, and the third sub-pixel may respectively include an R (red) sub-pixel, a G (green) sub-pixel, and a B (blue) sub-pixel. Accordingly, the fourth sub-pixel above-mentioned may be one of the R sub-pixel, the G sub-pixel, and the B sub-pixel. Alternatively, the first sub-pixel, the second sub-pixel, and the third sub-pixel may include a C (cyan) sub-pixel, an M (magenta) sub-pixel, and a Y (yellow) sub-pixel, respectively. Accordingly, the fourth sub-pixel above-mentioned may be one of the C sub-pixel, the M sub-pixel, and the Y sub-pixel. Of course, the first sub-pixel, the second sub-pixel, and the third sub-pixel may be other types of sub-pixels that can display white through a combination thereof.

The types of display devices to which the above display substrate is applied are not limited herein. The display devices to which the display substrate can be applied include, but are not limited to, various types of liquid crystal displays and various self-luminous displays such as OLED displays. Since each second sub-pixel row in the sub-pixel array comprises W (white) sub-pixels, and the W sub-pixels have relatively higher transmittance, in the case where a display device comprising the display substrate provided by the embodiment of the present disclosure is used to display an image, the brightness of displayed images can be significantly improved, thereby helping to improve the quality of displayed images.

In addition, the specific numbers and arrangements of the first sub-pixels, the second sub-pixels, and the third sub-pixels in the first sub-pixel row, as well as the specific numbers and arrangements of the fourth sub-pixels and the W sub-pixels in the second sub-pixel row in the sub-pixel array of the display substrate are not limited herein, either.

In some embodiments, each first sub-pixel row of the plurality of first sub-pixel rows comprises a plurality of first sub-pixel units, and each first sub-pixel unit comprises one first sub-pixel, one second sub-pixel, and one third sub-pixel. The first sub-pixel units of the plurality of first sub-pixel units are arranged successively in the row direction of the sub-pixel array to form one first sub-pixel row. Each second sub-pixel row of the plurality of second sub-pixel rows comprises a plurality of second sub-pixel units, and each second sub-pixel unit comprises one fourth sub-pixel and at least one W sub-pixel. The second sub-pixel units of the plurality of second sub-pixel units are arranged successively in the row direction of the sub-pixel array to form one second sub-pixel row.

In order to facilitate description of the embodiments of the present disclosure, the display substrate provided by the embodiment of the present disclosure will be described in detail by way of example below based on an example that the first sub-pixel, the second sub-pixel and the third sub-pixel are an R sub-pixel, a G sub-pixel and a B sub-pixel, respectively, and the fourth sub-pixel is a B sub-pixel. It can be understood that the features of the embodiment described in conjunction with the case where the first sub-pixel, the second sub-pixel, the third sub-pixel, and the fourth sub-pixel are an R sub-pixel, a G sub-pixel, a B sub-pixel, and a B sub-pixel respectively are also applicable to the cases where the first sub-pixel, the second sub-pixel, the third sub-pixel, and the fourth sub-pixel are of other types of sub-pixels.

Figures 1, 2:
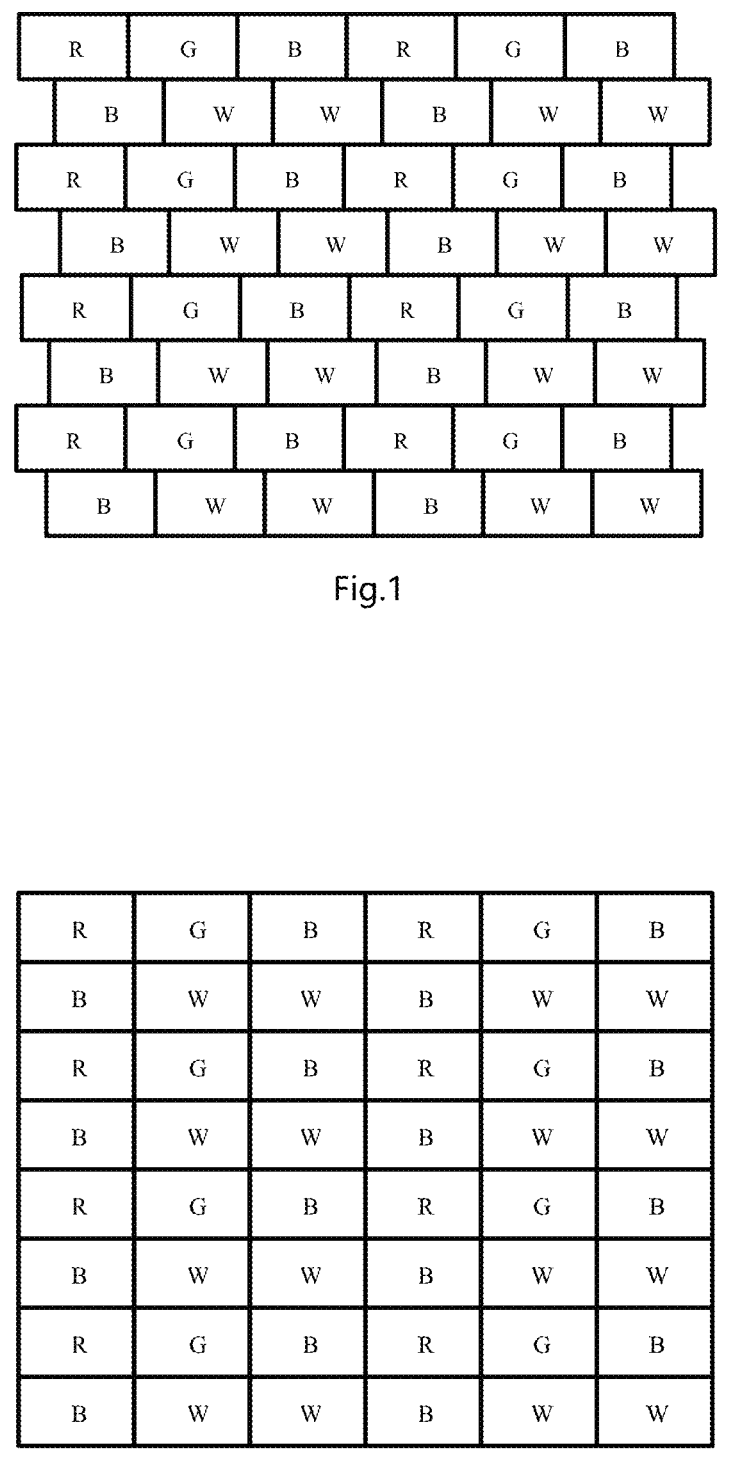

FIGS. 1 to 7 illustrate different examples of the arrangement of the sub-pixel array in a display substrate provided by an embodiment of the present disclosure. For simplicity, the examples in FIGS. 1 to 7 all illustrate eight sub-pixel rows and six sub-pixel columns only, that is, the sub-pixel array can be regarded as an 8*6 array. Those skilled in the art can obviously obtain sub-pixel arrays of different sizes according to the principles revealed herein.

As shown in FIGS. 1 to 7, each first sub-pixel row in the sub-pixel array of the display substrate comprises a plurality of first sub-pixel units, each first sub-pixel unit comprises one R sub-pixel, one G sub-pixel and one B sub-pixel, and the first sub-pixel units of the plurality of first sub-pixel units are arranged successively in the row direction of the sub-pixel array to form one first sub-pixel row (RGB sub-pixel row). Each second sub-pixel row in the sub-pixel array comprises a plurality of second sub-pixel units, each second sub-pixel unit comprises one B sub-pixel and at least one W sub-pixel, and the second sub-pixel units of the plurality of second sub-pixel units are arranged successively in the row direction of the sub-pixel array to form one second sub-pixel row (BW sub-pixel row).

As shown in FIGS. 1, 3, 4, 5 and 6, any first sub-pixel row (RGB sub-pixel row) in the sub-pixel array and a second sub-pixel row (BW sub-pixel row) adjacent to the any first sub-pixel row are offset from each other by a predetermined distance in the column direction of the sub-pixel array, and the predetermined distance is greater than zero and less than the width of the first sub-pixel (R), the second sub-pixel (G), or the third sub-pixel (B) in the row direction. Such an arrangement of sub-pixels even facilitates rendering of each sub-pixel of the sub-pixel array, so that the definition of displayed images is improved. Further, in some embodiments, the above predetermined distance is half of the width of the first sub-pixel, the second sub-pixel, or the third sub-pixel in the row direction.

Figure 4:
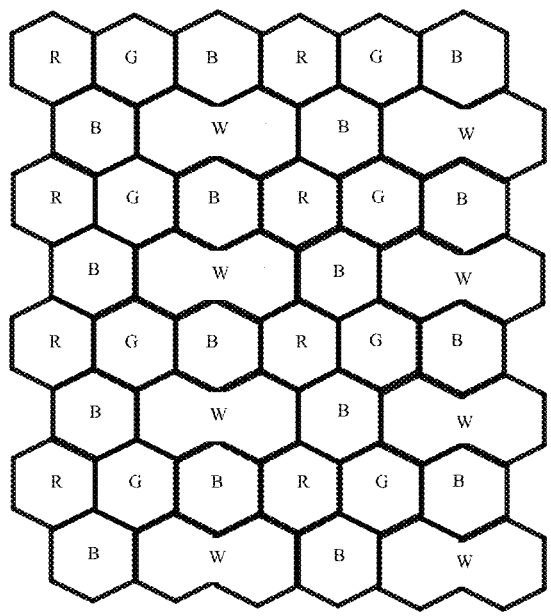

The sub-pixels in the sub-pixel array in the display substrate provided by the embodiment of the disclosure may have any suitable shape. In FIG. 3, the R sub-pixel, the B sub-pixel, the G sub-pixel, and the W sub-pixel all have a hexagonal shape. In FIG. 4, the R sub-pixel, the B sub-pixel, and the G sub-pixel all have a hexagonal shape, and the W sub-pixel exhibit a decagonal shape. In other examples, the R sub-pixel, the B sub-pixel, the G sub-pixel, and the W sub-pixel all may have a rectangular shape.

According to some embodiments of the disclosure, the width of any sub-pixel of the R sub-pixel, the G sub-pixel, the B sub-pixel, and the W sub-pixel in the sub-pixel array in the row direction of the sub-pixel array is greater than or equal to the height of the any sub-pixel in the column direction of the sub-pixel array. For example, in the example of the sub-pixel array shown in FIG. 3, each of the R sub-pixel, the G sub-pixel, the B sub-pixel, and the W sub-pixel may have a regularly hexagonal shape, that is, the width of each sub-pixel in the row direction of the sub-pixel array is equal to the height of the sub-pixel in the column direction of the sub-pixel array. In the example shown in FIG. 1 or 2, each of the R sub-pixel, the G sub-pixel, the B sub-pixel, and the W sub-pixel has a rectangular shape, and the width of each sub-pixel in the row direction of the sub-pixel array may be greater than or equal to the height of the sub-pixel in the column direction of the sub-pixel array. Compared with a conventional display device that includes the same total number of sub-pixels, this technical solution can reduce the hardware cost of a display device, because this embodiment actually achieves a decrease in the total number of sub-pixel columns (i.e., the sum of the numbers of all R sub-pixels, G sub-pixels, and B sub-pixels in each RGB sub-pixel row, or the sum of the numbers of all B sub-pixels and W sub-pixels in each BW sub-pixel row) in the sub-pixel array by increasing the total number of sub-pixel rows (including all the RGB sub-pixel rows and BW sub-pixel rows) in the sub-pixel array. Accordingly, the number of data drivers required by the display device to provide data signals to each column of sub-pixels can be decreased, while only the number of gate drivers used to drive each row of sub-pixels is increased. The cost of the data driver is higher than the cost of the gate driver, so that the overall cost of the display device can be reduced.

Accordingly, according to some embodiments of the disclosure, the sum of the number of rows of the plurality of RGB sub-pixel rows and the number of rows of the plurality of BW sub-pixel rows in the sub-pixel array is greater than the sum of the numbers of all R sub-pixels, G sub-pixels, and B sub-pixels in each RGB sub-pixel row, or the sum of the numbers of all B sub-pixels and W sub-pixels in each BW sub-pixel row. For example, if the actual sub-pixel array of the display device includes N sub-pixel arrays as shown in FIG. 1, the sum of the number of rows of the RGB sub-pixel rows and the number of rows of the BW sub-pixel rows in the actual sub-pixel array is 8*N, and the sum of the numbers of all R sub-pixels, G sub-pixels, and B sub-pixels in each RGB sub-pixel row is 6*N. As a result, the number of data drivers required by the display device can be decreased, and the hardware cost of the display device can be reduced.

According to some embodiments of the disclosure, the sub-pixel array of the display substrate comprises a plurality of RGB sub-pixel rows and a plurality of BW sub-pixel rows that are alternately arranged. Each B sub-pixel in any RGB sub-pixel row of the plurality of RGB sub-pixel rows is contiguous to at least one W sub-pixel in a BW sub-pixel row adjacent to the any RGB sub-pixel row, and each B sub-pixel in the adjacent BW sub-pixel row is contiguous to at least one of the R sub-pixel and the G sub-pixel in the any RGB sub-pixel row.

The term "contiguous" mentioned herein is used to describe the positional relationship between two sub-pixels in a sub-pixel array, and means that "two sub-pixels are adjacent to each other and their boundary lines at least partially overlap in the case of ignoring the gap or spacing between adjacent sub-pixels in the sub-pixel array". By way of example, the meaning of this contiguous relationship will be further explained in specific examples below. For the sake of brevity, none of FIGS. 1 to 7 shows the gaps between adjacent sub-pixels in the sub-pixel array.

For example, as shown in FIG. 1, the lower boundary line of the rectangular B sub-pixel in the RGB sub-pixel row partially overlaps the upper boundary lines of two rectangular W sub-pixels in the adjacent BW sub-pixel row, and each rectangular B sub-pixel in the adjacent BW sub-pixel row partially overlaps the lower boundary lines of both the rectangular R sub-pixel and the rectangular G sub-pixel in the RGB sub-pixel row. In the example of FIG. 2, the lower boundary line of the rectangular B sub-pixel in the RGB sub-pixel row completely overlaps the upper boundary line of one rectangular W sub-pixel in the adjacent BW sub-pixel row, and the upper boundary line of each B sub-pixel in the adjacent BW sub-pixel row completely overlaps the lower boundary line of the R sub-pixel in the RGB sub-pixel row. In FIG. 3, the two lower boundary lines of the hexagonal B sub-pixel in the RGB sub-pixel row overlaps the two upper boundary lines of two hexagonal W sub-pixels in the adjacent BW sub-pixel row, respectively, and the two upper boundary lines of the hexagonal B sub-pixel in the adjacent BW sub-pixel row overlaps one lower boundary line of the hexagonal R sub-pixel and one lower boundary line of the hexagonal G sub-pixel in the RGB sub-pixel row, respectively. In the example of FIG. 4, the two lower boundary lines of the hexagonal B sub-pixel in the RGB sub-pixel row partially overlaps the upper boundary line of one W sub-pixel in the adjacent BW sub-pixel row, and the two upper boundary lines of the B sub-pixel in the adjacent BW sub-pixel row overlaps one lower boundary line of the hexagonal R sub-pixel and one lower boundary line of the hexagonal G sub-pixel in the RGB sub-pixel row, respectively. In this way, in the sub-pixel array, multiple approximately triangular RGB pixel regions composed of R sub-pixels, G sub-pixels and B sub-pixels can be realized, and some other B sub-pixels are contiguous to corresponding W sub-pixels so that multiple approximately triangular BW pixel regions can also be formed. Meanwhile, the W sub-pixel obviously has higher light transmittance, while the B sub-pixel has relatively lower light transmittance. As a result, it is possible to not only greatly improve the brightness of displayed images, but also achieve a better white balance effect.

Figures 7, 8A, 8B:
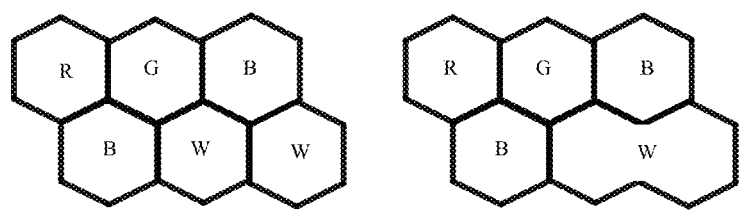

As shown in FIGS. 1 to 3, according to some embodiments of the disclosure, each second sub-pixel unit in the BW sub-pixel row comprises one B sub-pixel and two W sub-pixels, and one of the two W sub-pixels is between the B sub-pixel and the other of the two W sub-pixels. FIG. 8a illustrates an example of a sub-pixel repeating group in the sub-pixel array. In this case, the ratio of the numbers of R sub-pixels, G sub-pixels, B sub-pixels, and W sub-pixels in the sub-pixel array is 1:1:2:2. Alternatively, as shown in FIG. 4, in another embodiment, each second sub-pixel unit in the BW sub-pixel row comprises one B sub-pixel and one W sub-pixel. The width of the W sub-pixel in the row direction of the sub-pixel array is greater than the width of the B sub-pixel in the row direction of the sub-pixel array, and the width of the W sub-pixel in the row direction of the sub-pixel array may be, for example, twice the width of the B sub-pixel in the row direction of the sub-pixel array. In this example, in the case that a single R sub-pixel, a single G sub-pixel, and a single B sub-pixel have approximately equal areas, the area of a single W sub-pixel is approximately twice the area of the single R sub-pixel, the single G sub-pixel, or the single B sub-pixel. FIG. 8b illustrates an example of a sub-pixel repeating group in the sub-pixel array. At that time, the ratio of the numbers of R sub-pixels, G sub-pixels, B sub-pixels, and W sub-pixels in the sub-pixel array is 1:1:2:1. By allowing the B sub-pixels and the W sub-pixels to have a relatively large number or have a relatively large area, a good balance between improving the brightness of displayed images and realizing a white balance effect can be achieved. According to some embodiments of the disclosure, the spacing between the above two W sub-pixels is greater than the spacing between any two sub-pixels of the R sub-pixel, the B sub-pixel, the G sub-pixel, and the W sub-pixel, so that light crosstalk between W sub-pixels with higher transmittance can be reduced.

In a brightness test experiment based on an OLED display device applying the sub-pixel arrangement shown in FIG. 3, in the case of the same total number of sub-pixels, the brightness of displayed images of the OLED display device applying the sub-pixel arrangement shown in the embodiment of the disclosure is increased by more than 1.5 times compared with an OLED display device having a conventional RGB sub-pixel arrangement. FIG. 9 illustrates an RGB sub-pixel array in a conventional OLED display device. According to an exemplary experiment of the disclosure, by measuring the display brightnesses of the sub-pixels and performing normalization with the display brightness of the W sub-pixel as a reference, it can be obtained that the brightness ratio of the R sub-pixel, the G sub-pixel, the B sub-pixel and the W sub-pixel is 0.299:0.587:0.114:1, so the ratio of the brightness of displayed images of the OLED display device applying the display substrate provided by the embodiment of the disclosure to the brightness of displayed images of the OLED display device having the sub-pixel array shown in FIG. 9 is:

$$\frac{0.299 + 0.587 + 2*0.114 + 2*1}{2*(0.299 + 0.587 + 0.114)} = 1.557$$

According to some embodiments of the disclosure, as shown in FIG. 3, the R sub-pixel, the G sub-pixel, the B sub-pixel, and the W sub-pixel all exhibit a hexagonal shape. The hexagon may be a regular hexagon. The area of the W sub-pixel is smaller than the area of any one of the R sub-pixel, the G sub-pixel, and the B sub-pixel, that is, the W sub-pixel has the smallest area among the R sub-pixel, the G sub-pixel, the B sub-pixel, and the W sub-pixel, which helps to better realize the adjustment of a white balance of the display device. Further, in another embodiment, the area of the B sub-pixel may be larger than the area of any one of the R sub-pixel, the G sub-pixel, and the W sub-pixel.

Figure 5:
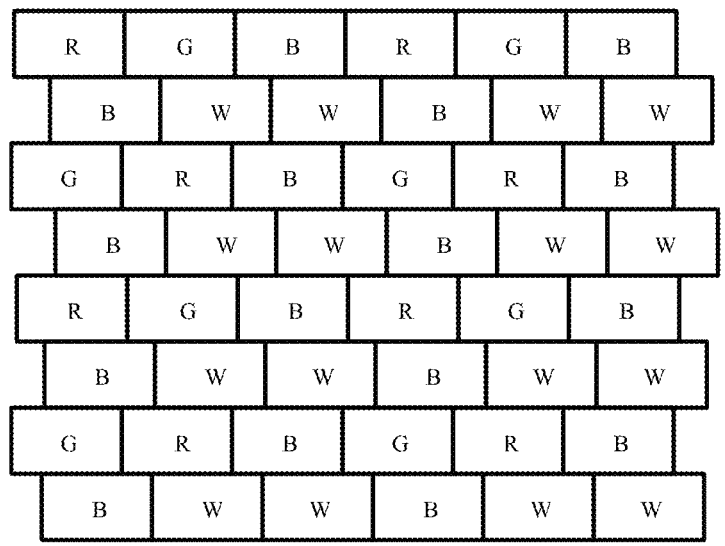
Figure 6:
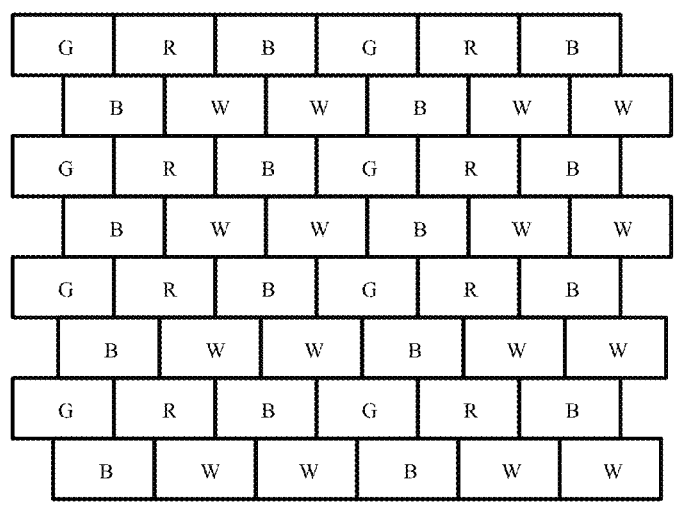

As described above, according to the embodiment of the disclosure, each RGB sub-pixel row in the sub-pixel array comprises a plurality of first sub-pixel units, and each first sub-pixel unit comprises one R sub-pixel, one G sub-pixel, and one B sub-pixel. The R sub-pixel, the G sub-pixel, and the B sub-pixel in each first sub-pixel unit may be arranged in different orders. For example, as shown in FIGS. 1 to 4, the R sub-pixel, the G sub-pixel, and the B sub-pixel in the first sub-pixel unit are arranged successively in the row direction of the sub-pixel array in an RGB order. Or, as shown in FIGS. 6 and 7, the R sub-pixel, the G sub-pixel, and the B sub-pixel in the first sub-pixel unit are arranged successively in the row direction of the sub-pixel array in a GRB order. Alternatively, the R sub-pixel, the G sub-pixel, and the B sub-pixel in different RGB sub-pixel rows may be arranged in different orders. In some embodiments, the R sub-pixel, the G sub-pixel and the B sub-pixel in the first sub-pixel unit in a K-th RGB sub-pixel row of the plurality of RGB sub-pixel rows in the sub-pixel array are arranged successively in the row direction of the sub-pixel array in an RGB order, and the R sub-pixel, the G sub-pixel and the B sub-pixel in the first sub-pixel unit in a (K+1)-th RGB sub-pixel row of the plurality of RGB sub-pixel rows are arranged successively in the row direction of the sub-pixel array in a GRB order, K being an integer greater than or equal to 1. As shown in FIG. 5, the R sub-pixels, the G sub-pixels and the B sub-pixels in odd-numbered rows of RGB sub-pixels in the plurality of RGB sub-pixel rows in the sub-pixel array are arranged in an RGB order, and the R sub-pixels, the G sub-pixels and the B sub-pixels in even-numbered rows of RGB sub-pixels are arranged in a GRB order.

As described above, the display substrate provided by the embodiment of the present disclosure may be applied to an LCD display device, and may also be applied to an OLED display device. In the case where the display substrate is applied to an LCD display device, the display substrate may be a color filter substrate of the LCD display device. In this case, the display substrate comprises a color resist layer attached to the base substrate. The color resist layer comprises a color resist unit array, and the colors of the color resist units in the color resist unit array are in one-to-one correspondence with the sub-pixels in the sub-pixel array. In some embodiments, the color filter substrate may further comprise a black matrix, and the black matrix includes a light blocking layer for isolating adjacent color resist units in the color resist unit array.

In the case where the display substrate is applied to an electroluminescent diode display device (for example, an OLED display device), the display substrate further comprises an electroluminescent material in each sub-pixel of the sub-pixel array, and the electroluminescent material is configured to emit light of a color corresponding to the sub-pixel where it is located under the effect of an electrical signal. Further, the display substrate may further comprise a sub-pixel definition layer on the base substrate, and the sub-pixel definition layer defines the sub-pixel array. Alternatively, according to another embodiment of the disclosure, the OLED display device may also comprise the above color resist layer. In this case, the display substrate of the OLED display device may be configured to emit white light, and the white light passes through the color resist units in the color resist unit array of the color resist layer to present different colors, thereby realizing color display.

Another embodiment of the disclosure provides a display panel. The display panel may comprise the display substrate as described in any of the foregoing embodiments. For an LCD display panel, in addition to the above display substrate (which is a color filter substrate in this case), it further comprises an array substrate and a liquid crystal layer between the array substrate and the color filter substrate. For an OLED display panel, it may comprise the display substrate as described above and an encapsulation cover plate above the display substrate. In some embodiments, the OLED display panel may be a silicon-based OLED display panel, and the size (for example, diameter) of each sub-pixel of the silicon-based OLED display panel ranges from 1 μm to 10 μm. It can be understood that the LCD display panel or the OLED display panel both may further comprise any other necessary elements and structures, which are known to those skilled in the art and will not be repeated here.

Figure 12:
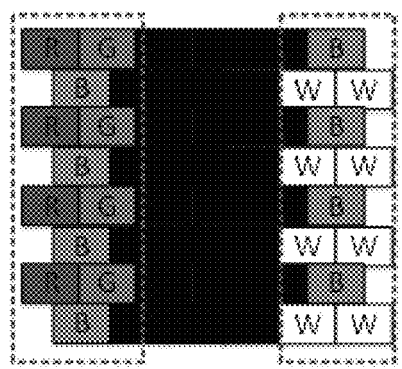
Figure 13:
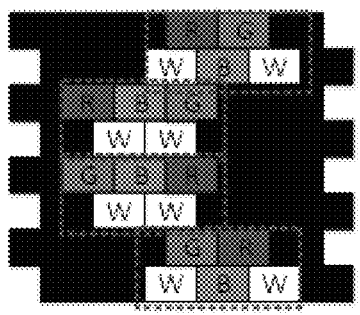
FIGS. 13, 14 and 15 illustrate views of a display panel comprising the sub-pixel array shown in FIG. 5 displaying white dots, white horizontal lines, and white vertical lines, respectively.
Figure 14:
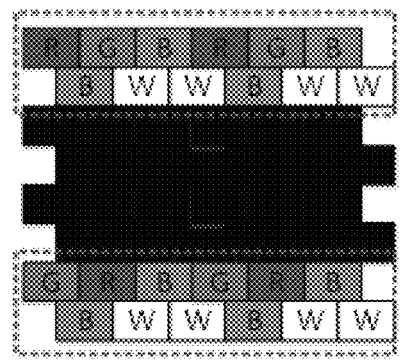
Figure 15:
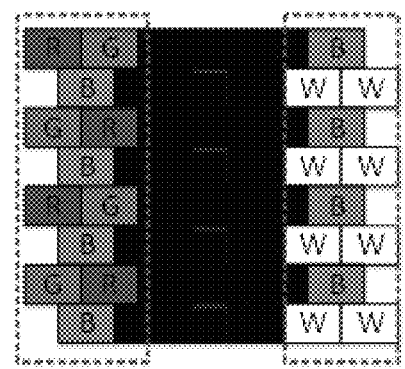

FIGS. 10, 11 and 12 illustrate schematic views of a display panel comprising the sub-pixel array shown in FIG. 1 displaying white dots, white horizontal lines, and white vertical lines, respectively. FIGS. 13, 14 and 15 illustrate schematic views of a display panel comprising the sub-pixel array shown in FIG. 5 displaying white dots, white horizontal lines, and white vertical lines, respectively. The dashed boxes in each of FIGS. 10 to 15 respectively represent white dots, white horizontal lines, or white vertical lines that are driven to light up.

A further embodiment of the present disclosure provides a method of displaying an image based on a display panel. The display panel may comprise the display substrate described in any of the foregoing embodiments.

Figure 16:
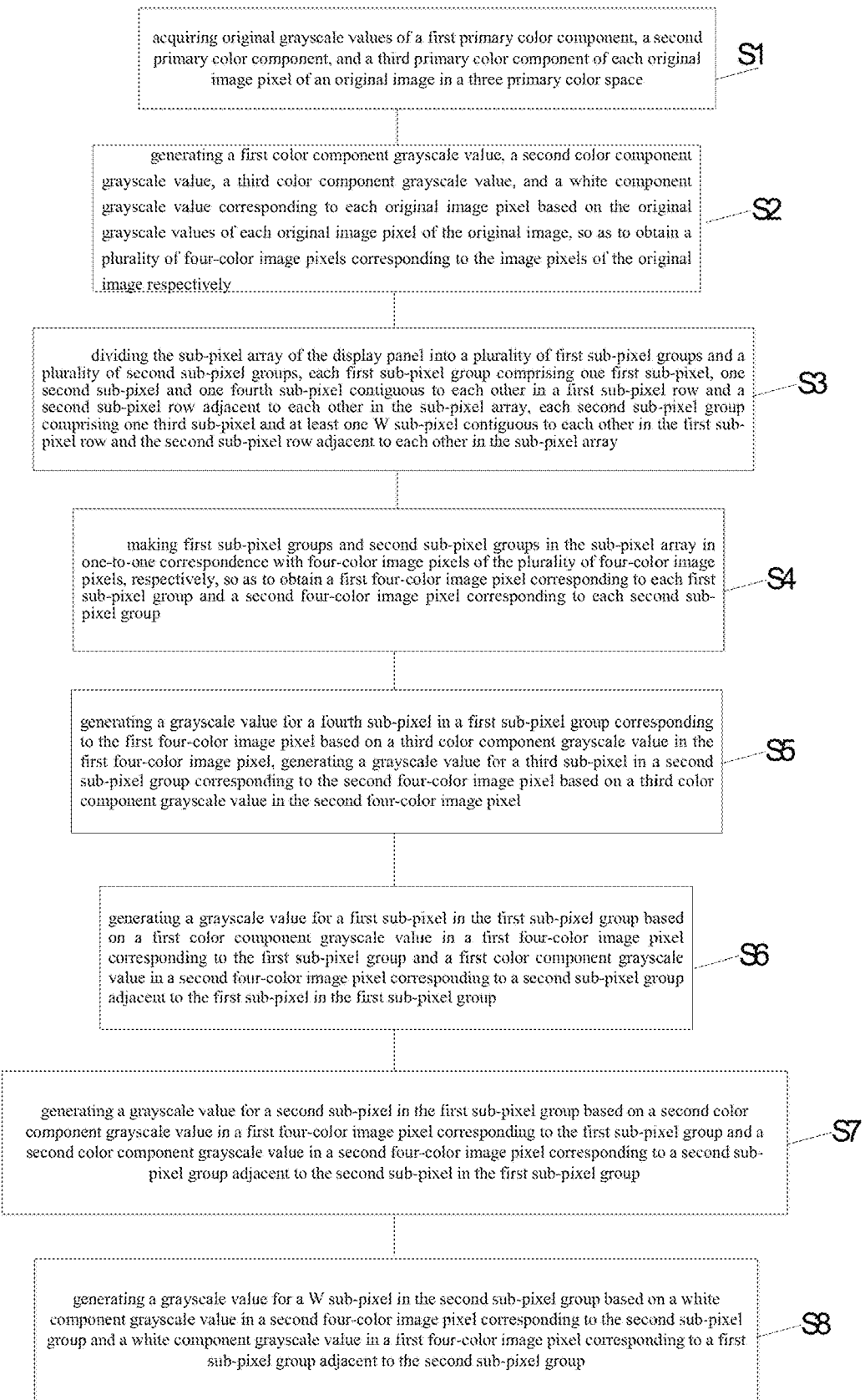
FIG. 16 illustrates the main steps involved in a method of displaying an image based on a display panel provided by an embodiment of the present disclosure.

FIG. 16 illustrates a process of a method of displaying an image based on a display panel. As shown in FIG. 16, the method comprises: S1, acquiring original grayscale values of a first primary color component, a second primary color component, and a third primary color component of each original image pixel of an original image in a three primary color space; S2, generating a first color component grayscale value, a second color component grayscale value, a third color component grayscale value, and a white component grayscale value corresponding to each original image pixel based on the original grayscale values of original image pixels of the original image, so as to obtain a plurality of four-color image pixels corresponding to the image pixels of the original image respectively; S3, dividing the sub-pixel array of the display panel into a plurality of first sub-pixel groups and a plurality of second sub-pixel groups, each first sub-pixel group comprising one first sub-pixel, one second sub-pixel and one fourth sub-pixel contiguous to each other in a first sub-pixel row and a second sub-pixel row adjacent to each other in the sub-pixel array, each second sub-pixel group comprising one third sub-pixel and at least one W sub-pixel contiguous to each other in the first sub-pixel row and the second sub-pixel row adjacent to each other in the sub-pixel array; S4, making first sub-pixel groups and second sub-pixel groups in the sub-pixel array in one-to-one correspondence with four-color image pixels of the plurality of four-color image pixels, respectively, so as to obtain a first four-color image pixel corresponding to each first sub-pixel group and a second four-color image pixel corresponding to each second sub-pixel group; S5, generating a grayscale value for a fourth sub-pixel in a first sub-pixel group corresponding to the first four-color image pixel based on a third color component grayscale value in the first four-color image pixel, generating a grayscale value for a third sub-pixel in a second sub-pixel group corresponding to the second four-color image pixel based on a third color component grayscale value in the second four-color image pixel; S6, generating a grayscale value for a first sub-pixel in the first sub-pixel group based on a first color component grayscale value in a first four-color image pixel corresponding to the first sub-pixel group and a first color component grayscale value in a second four-color image pixel corresponding to a second sub-pixel group adjacent to the first sub-pixel in the first sub-pixel group; S7, generating a grayscale value for a second sub-pixel in the first sub-pixel group based on a second color component grayscale value in a first four-color image pixel corresponding to the first sub-pixel group and a second color component grayscale value in a second four-color image pixel corresponding to a second sub-pixel group adjacent to the second sub-pixel in the first sub-pixel group; S8, generating a grayscale value for a W sub-pixel in the second sub-pixel group based on a white component grayscale value in a second four-color image pixel corresponding to the second sub-pixel group and a white component grayscale value in a first four-color image pixel corresponding to a first sub-pixel group adjacent to the second sub-pixel group. The "three primary colors" mentioned herein refer to three basic colors that can be synthesized into white. Examples of the three primary colors include but are not limited to red (R), green (G) and blue (B), as well as cyan (C), magenta (M) and yellow (Y). Therefore, the three primary color space may be an RGB color space or a CMY color space.

It can be understood that the steps S1 to S8 listed here are intended to clearly describe the method of displaying an image based on the display panel, but are not used to limit the number of steps of the method of displaying an image based on the display panel proposed by the present disclosure and the order in which they are executed. For example, the above steps S3 and S4 may be performed in one step, and multiple steps of the above steps S5 to S8 may be performed in the same step or may be divided into different steps. Those skilled in the art can obtain other embodiments including different steps based on the contents described in the above steps S1 to S8.

In some embodiments, the first sub-pixel, the second sub-pixel and the third sub-pixel include an R sub-pixel, a G sub-pixel and a B sub-pixel, respectively, and the fourth sub-pixel includes a B sub-pixel. In this case, the three primary color space includes an RGB color space. The first primary color component, the second primary color component and the third primary color component include a red component, a green component and a blue component, respectively, and the first color component grayscale value, the second color component grayscale value and the third color component grayscale value include a first red component grayscale value, a first green component grayscale value and a first blue component grayscale value, respectively. The four-color image pixel include an RGBW image pixel, and the first four-color image pixel and the second four-color image pixel include a first RGBW image pixel and a second RGBW image pixel, respectively. The third color component grayscale value in the first four-color image pixel includes the first blue component grayscale value in the first RGBW image pixel, and the third color component grayscale value in the second four-color image pixel includes the first blue component grayscale value in the second RGBW image pixel. The fourth sub-pixel in the first sub-pixel group and the third sub-pixel in the second sub-pixel group both include a B sub-pixel.

The method of displaying an image based on the display panel proposed by the embodiment of the present disclosure will be described in detail below with respect to the case that the first sub-pixel, the second sub-pixel and the third sub-pixel include an R sub-pixel, a G sub-pixel and a B sub-pixel, respectively, and the fourth sub-pixel includes a B sub-pixel.

Figure 17:
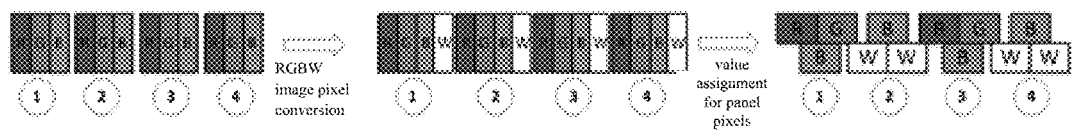
FIG. 17 illustrates the main process of a method of displaying an image based on a display panel provided by an embodiment of the present disclosure.

The main process involved in the method of displaying an image based on the display panel provided by the above embodiment of the present disclosure can be summarized as FIG. 17. Firstly, the original image pixels of an original image provided to the display panel are converted into RGBW image pixels. Specifically, the original grayscale values of a red component, a green component and a blue component of each original image pixel of the original image in the RGB color space can be obtained based on the original image. Therefore, each original image pixel can be regarded as one RGB image pixel. Next, each RGB image pixel can be processed to obtain its corresponding RGBW image pixel, realizing the "RGBW image pixel conversion" shown in FIG. 17. Then, the sub-pixel array of the display panel is divided to obtain a plurality of first sub-pixel groups and a plurality of second sub-pixel groups, and the plurality of RGBW image pixels obtained previously are mapped with the divided sub-pixel array, so that each first sub-pixel group or each second sub-pixel group corresponds to one RGBW image pixel. On this basis, the grayscale value of each sub-pixel in a corresponding first sub-pixel group or second sub-pixel group is obtained based on the grayscale values of the RGBW image pixels.

Hereinafter, the method of displaying an image based on the display panel proposed by the embodiment of the present disclosure will be specifically described by taking the display panel comprising the sub-pixel array shown in FIG. 1 as an example.

FIG. 17 illustrates two first sub-pixel groups (numbered ① and ③) and two second sub-pixel groups (numbered ② and ④) obtained based on an RGB sub-pixel row and a BW sub-pixel row adjacent to each other in the sub-pixel array shown in FIG. 1. The first sub-pixel group includes one R sub-pixel, one G sub-pixel and one B sub-pixel which generally distribute in an inverted triangle, and the second sub-pixel group includes one B sub-pixel and two W sub-pixels which generally distribute in a normal triangle. The first sub-pixel group and the second sub-pixel group are alternately arranged along the row direction of the sub-pixel array. Correspondingly, FIG. 17 illustrate four RGBW image pixels (numbered ①②③④, respectively) in one-to-one correspondence with the two first sub-pixel groups and the two second sub-pixel groups, respectively, and the four RGBW image pixels are derived from four RGB image pixels of the original image, respectively.

According to some embodiments of the disclosure, the white component grayscale value in the RGBW image pixel is a minimum value among the original grayscale values of the red component, the green component and the blue component of a respective image pixel of the original image. The first red component grayscale value, the first green component grayscale value, and the first blue component grayscale value in an RGBW image pixel are linear functions of the original grayscale values of the red component, the green component and the blue component of a respective image pixel of the original image, respectively. For example, in some embodiments, the first red component grayscale value, the first green component grayscale value or the first blue component grayscale value in an RGBW image pixel can be calculated based on the following formula (1):

$$GL_1 = A*GL - W_1 \quad \text{formula (1)}$$

wherein $GL_1$ represents the first red component grayscale value, the first green component grayscale value or the first blue component grayscale value, $W_1$ represents the white component grayscale value, and $GL$ represents an original gray scale value of the red component, the green component or the blue component of a respective image pixel of the original image, wherein $$A = \frac{M + W_1}{M},$$

where M represents a maximum value among the original grayscale values of the red component, the green component and the blue component of a respective image pixel of the original image.

Specifically, if the original grayscale values of the red component, the green component and the blue component of an image pixel of the original image are represented by $R_0$, $G_0$, and $B_0$, respectively, the first red component grayscale value, the first green component grayscale value, the first blue component grayscale value, and the white component grayscale value in an RGBW image pixel are represented by $R_1$, $G_1$, $B_1$ and $W_1$, respectively, then $W_1 = \min(R_0, G_0, B_0)$, and the above $R_1$, $G_1$ and $B_1$ can be represented by the following formula (2):

$$\begin{pmatrix} R_1 \\ G_1 \\ B_1 \end{pmatrix} = A * \begin{pmatrix} R_0 \\ G_0 \\ B_0 \end{pmatrix} - W_1, \quad A = \frac{\max(R_0, G_0, B_0) + W_1}{\max(R_0, G_0, B_0)} \quad \text{formula (2)}$$

$\max(R_0, G_0, B_0)$ represents the maximum value among $R_0$, $G_0$ and $B_0$. Of course, the manner of obtaining the first red component grayscale value, the first green component grayscale value, the first blue component grayscale value, and the white component grayscale value $R_1$, $G_1$, $B_1$ and $W_1$ in the RGBW image pixel based on the original grayscale values $R_0$, $G_0$ and $B_0$ of the red component, the green component and the blue component of an image pixel of the original image is not limited to the above example. For example, $W_1$ may also be a maximum value or an average value among $R_0$, $G_0$ and $B_0$, which is not limited in the embodiment of the present disclosure.

Figure 18:
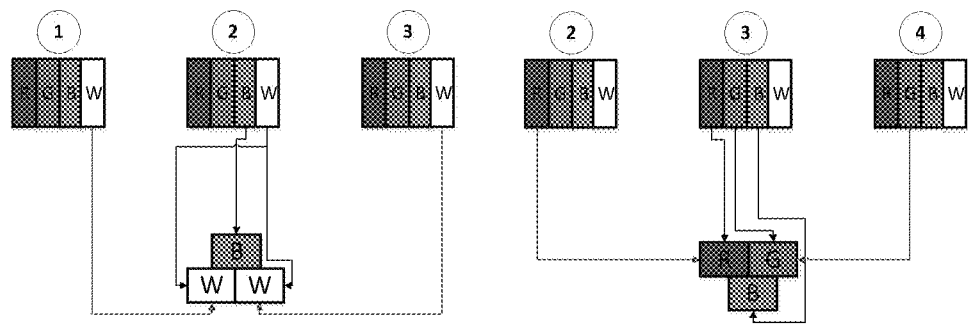
FIG. 18 illustrates a method for generating a grayscale value of each sub-pixel of a sub-pixel array of a display panel provided by an embodiment of the present disclosure.

According to some embodiments of the disclosure, generating a grayscale value for a B sub-pixel in a first sub-pixel group corresponding to the first RGBW image pixel based on the first blue component grayscale value in the first RGBW image pixel mentioned in the step S5 may comprise: setting the grayscale value of the B sub-pixel in the first sub-pixel group corresponding to the first RGBW image pixel to be the first blue component grayscale value in the first RGBW image pixel, and generating a grayscale value for a B sub-pixel in a second sub-pixel group corresponding to the second RGBW image pixel based on the first blue component grayscale value in the second RGBW image pixel mentioned in the step S5 may comprise: setting the grayscale value of the B sub-pixel in the second sub-pixel group corresponding to the second RGBW image pixel to be the first blue component grayscale value in the second RGBW image pixel. That is, the first blue component grayscale value in the first RGBW image pixel may be directly assigned to the B sub-pixel in the first sub-pixel group corresponding to the first RGBW image pixel, and the first blue component grayscale value in the second RGBW image pixel may be directly assigned to the B sub-pixel in the second sub-pixel group corresponding to the second RGBW image pixel. This can be understood more clearly by FIG. 18. As shown in FIG. 18, the grayscale value of the B sub-pixel in the second sub-pixel group in the sub-pixel array of the display panel corresponding to the second RGBW image pixel shown in FIG. 17 may be equal to the grayscale value of the B sub-pixel in the second RGBW image pixel, i.e., the first blue component grayscale value. Alternatively, the grayscale value of the B sub-pixel in the second sub-pixel group may be a linear function of the first blue component grayscale value in the second RGBW image pixel. Likewise, the grayscale value of the B sub-pixel in the first sub-pixel group in the sub-pixel array of the display panel corresponding to the third RGBW image pixel shown in FIG. 17 may be equal to the grayscale value of the B sub-pixel in the third RGBW image pixel, or the grayscale value of the B sub-pixel in the first sub-pixel group may be a linear function of the first blue component grayscale value in the third RGBW image pixel.

According to some embodiments of the present disclosure, the grayscale value for the R sub-pixel in the first sub-pixel group and the grayscale value for the G sub-pixel in the first sub-pixel group may be calculated based on any one of the following formulas (3) to (6):

$$f = 0.5a + 0.5b; \quad \text{formula (3)}$$

$$f = \max(a, b); \quad \text{formula (4)}$$

$$f = \min(a, b); \quad \text{formula (5)}$$

$$f = \frac{a}{a+b}*a + \frac{b}{a+b}*b \quad \text{formula (6)}$$

wherein f represents the grayscale value for the R sub-pixel in the first sub-pixel group or the grayscale value for the G sub-pixel in the first sub-pixel group, a represents the first red component grayscale value in the first RGBW image pixel corresponding to the first sub-pixel group or the first green component grayscale value in the first RGBW image pixel corresponding to the first sub-pixel group, b represents the first red component grayscale value in the second RGBW image pixel corresponding to the second sub-pixel group adjacent to the R sub-pixel in the first sub-pixel group or the first green component grayscale value in the second RGBW image pixel corresponding to the second sub-pixel group adjacent to the G sub-pixel in the first sub-pixel group, max(a, b) represents a maximum value of a and b, and min(a, b) represents a minimum value of a and b.

For example, for the R sub-pixel in the first sub-pixel shown in FIG. 18, its grayscale value (f can be expressed as $f_R$ in this case) is calculated based on the first red component grayscale value (a can be expressed as $R_{1(2)}$ in this case) in the RGBW image pixel numbered ② and the first red component grayscale value (b can be expressed as $R_{1(3)}$ in this case) in the RGBW image pixel numbered ③ as shown in FIG. 17. Specifically, $f_R=0.5R_{1(2)}+0.5R_{1(3)}$, or $f_R=\max(R_{1(2)}, R_{1(3)})$, or $f_R=\min(R_{1(2)}, R_{1(3)})$, or $$f_R = \frac{R_{1(2)}}{R_{1(2)} + R_{1(3)}}*R_{1(2)} + \frac{R_{1(3)}}{R_{1(2)} + R_{1(3)}}*R_{1(3)}.$$

Similarly, for the G sub-pixel in the first sub-pixel shown in FIG. 16, its grayscale value (f can be expressed as $f_G$ in this case) is calculated based on the first green component grayscale value (a may be expressed as $G_{1(3)}$ in this case) in the RGBW image pixel numbered ③ and the first green component grayscale value (b may be expressed as $G_{1(4)}$ in this case) in the RGBW image pixel numbered ④ as shown in FIG. 17. Specifically, $f_G=0.5G_{1(3)}+0.5G_{1(4)}$, or $f_G=\max(G_{1(3)}, G_{1(4)})$, or $f_G=\min(G_{1(3)}, G_{1(4)})$, or $$f_G = \frac{G_{1(3)}}{G_{1(3)} + G_{1(4)}}*G_{1(3)} + \frac{G_{1(4)}}{G_{1(3)} + G_{1(4)}}*G_{1(4)}.$$

As mentioned in the previous step S8, for the grayscale value of the W sub-pixel in the second sub-pixel group, it may be generated based on the white component grayscale value in the second RGBW image pixel corresponding to the second sub-pixel group and the white component grayscale value in the first RGBW image pixel corresponding to the first sub-pixel group adjacent to the second sub-pixel group. The specific calculation method for generating the grayscale value of the W sub-pixel in the second sub-pixel group is not limited here. In the case where the second sub-pixel group only includes one W sub-pixel (for example, the case shown in FIG. 4), the grayscale value of the W sub-pixel in the second sub-pixel group may be an average value of the white component grayscale value in the second RGBW image pixel corresponding to the second sub-pixel group and the white component grayscale value in the first RGBW image pixel corresponding to one of the first sub-pixels left and right adjacent to the second sub-pixel group, and may also be an average value of the white component grayscale value in the second RGBW image pixel corresponding to the second sub-pixel group and the white component grayscale values in two first RGBW image pixels corresponding to two first sub-pixels left and right adjacent to the second sub-pixel group. In the case where the second sub-pixel group includes two W sub-pixels, for example, the second sub-pixel group in FIG. 18, the grayscale value of each W sub-pixel in the second sub-pixel group may be calculated using a method similar to the method for calculating the grayscale value of the R sub-pixel or the G sub-pixel in the first sub-pixel group in FIG. 18. For example, if the grayscale value of the W sub-pixel on the left in the second sub-pixel group in FIG. 18 is represented by $f_{W1}$, and the grayscale value of the W sub-pixel on the right in the second sub-pixel group in FIG. 18 is represented by $f_{W2}$, $f_{W1}$ and $f_{W2}$ can be calculated by the following equations: $f_{W1}=0.5W_{1(1)}+0.5W_{1(2)}$, or $f_{W1}=\max(W_{1(1)}, W_{1(2)})$, or $f_{W1}=\min(W_{1(1)},W_{1(2)})$, or $$f_{W1} = \frac{W_{1(1)}}{W_{1(1)} + W_{1(2)}}*W_{1(1)} + \frac{W_{1(2)}}{W_{1(1)} + W_{1(2)}}*W_{1(2)}.$$

$W_{1(1)}$ represents the white component grayscale value in the RGBW image pixel numbered ① in FIG. 17, and $W_{1(2)}$ represents the white component grayscale value in the RGBW image pixel numbered ② in FIG. 17. Moreover, $f_{W2}=0.5W_{1(2)}+0.5W_{1(3)}$, or $f_{W2}=\max(W_{1(2)}, W_{1(3)})$, or $f_{W2}=\min(W_{1(2)}, W_{1(3)})$, or $$f_{W2} = \frac{W_{1(2)}}{W_{1(2)} + W_{1(3)}}*W_{1(2)} + \frac{W_{1(3)}}{W_{1(2)} + W_{1(3)}}*W_{1(3)}.$$

$W_{1(2)}$ represents the white component grayscale value in the RGBW image pixel numbered 2 in FIG. 17, and $W_{1(3)}$ represents the white component grayscale value in the RGBW image pixel numbered 3 in FIG. 17.

The grayscale value of each sub-pixel in the first sub-pixel group and the second sub-pixel in the sub-pixel array of the display panel is generated by the above method, which can realize image display with high definition and improve the user's satisfaction with displayed images. Of course, the specific method for generating the grayscale value of each sub-pixel in the first sub-pixel group and the second sub-pixel is not limited to the specific examples listed above, and those skilled in the art can modify the contents of the above examples based on the contents described herein so as to obtain other different methods for generating the grayscale value of each sub-pixel in the first sub-pixel group and the second sub-pixel in the sub-pixel array of the display panel.

For a display panel or display device applying the display substrate provided by the embodiment of the disclosure, the brightness of displayed images can be greatly improved, which is very beneficial for image display in a dark environment.

According to some embodiments of the present disclosure, the method of displaying an image based on the display panel may further comprise: turning off all W sub-pixels in the sub-pixel array in response to the intensity of the ambient light where the display panel is located being greater than a light intensity threshold; turning on all W sub-pixels in the sub-pixel array in response to the intensity of the ambient light being less than the light intensity threshold. Therefore, in some embodiments, the display panel may comprise a light sensor for sensing the intensity of ambient light in the environment where the display panel is located. In the case where the intensity of the ambient light is greater than the light intensity threshold, that is, the display panel is in a brighter environment, all W sub-pixels in the sub-pixel array of the display panel are turned off, which can improve the quality of displayed images and enhance the user's comfort in viewing images displayed by the display panel. In the case where the intensity of the ambient light is less than the light intensity threshold, that is, the display panel is in a darker environment, all W sub-pixels in the sub-pixel array of the display panel are turned on to satisfy the user's requirement for viewing displayed images clearly in a darker environment.

Some exemplary embodiments of the disclosure have been described in detail above, but those skilled in the art can understand and realize other variations of the disclosed embodiments based on the study of the drawings, the disclosure and the claims when practicing the claimed technical solutions. In the claims, the word "comprising" does not exclude the presence of other elements. Although some features are recorded in different dependent claims, the present invention is also intended to encompass embodiments that combine these features.

The invention claimed is:

1. A display substrate comprising:
a base substrate; and
a display region of the base substrate comprising a sub-pixel array, the sub-pixel array comprising a plurality of first sub-pixel rows and a plurality of second sub-pixel rows, each first sub-pixel row of the plurality of first sub-pixel rows comprising a plurality of first sub-pixels, a plurality of second sub-pixels, and a plurality of third sub-pixels, each second sub-pixel row of the plurality of second sub-pixel rows comprising a plurality of fourth sub-pixels and a plurality of white sub-pixels,
wherein each first sub-pixel of the plurality of first sub-pixels, each second sub-pixel of the plurality of second sub-pixels, and each third sub-pixel of the plurality of third sub-pixels are configured such that white is capable of being presented by combining a single first sub-pixel, a single second sub-pixel, and a single third sub-pixel, and each fourth sub-pixel of the plurality of fourth sub-pixels is selected from any one of the first sub-pixel, the second sub-pixel, and the third sub-pixel, and
wherein the first sub-pixel row of the plurality of first sub-pixel rows and the second sub-pixel row of the plurality of second sub-pixel rows are arranged alternately in a column direction of the sub-pixel array to form the sub-pixel array.

2. The display substrate according to claim 1,
wherein each first sub-pixel row of the plurality of first sub-pixel rows comprises a plurality of first sub-pixel units, each first sub-pixel unit comprises one first sub-pixel, one second sub-pixel and one third sub-pixel, and first sub-pixel units of the plurality of first sub-pixel units are arranged successively in a row direction of the sub-pixel array to form one first sub-pixel row, and
wherein each second sub-pixel row of the plurality of second sub-pixel rows comprises a plurality of second sub-pixel units, each second sub-pixel unit comprises one fourth sub-pixel and at least one white sub-pixel, and second sub-pixel units of the plurality of second sub-pixel units are arranged successively in the row direction of the sub-pixel array to form one second sub-pixel row.

3. A display substrate comprising:
a base substrate; and
a display region of the base substrate comprising a sub-pixel array, the sub-pixel array comprising a plurality of first sub-pixel rows and a plurality of second sub-pixel rows, each first sub-pixel row of the plurality of first sub-pixel rows comprising a plurality of first sub-pixels, a plurality of second sub-pixels, and a plurality of third sub-pixels, each second sub-pixel row of the plurality of second sub-pixel rows comprising a plurality of fourth sub-pixels and a plurality of white sub-pixels,
wherein each first sub-pixel of the plurality of first sub-pixels, each second sub-pixel of the plurality of second sub-pixels, and each third sub-pixel of the plurality of third sub-pixels are configured such that white is capable of being presented by combining a single first sub-pixel, a single second sub-pixel, and a single third sub-pixel, and each fourth sub-pixel of the plurality of fourth sub-pixels is selected from any one of the first sub-pixel, the second sub-pixel, and the third sub-pixel, and
wherein the first sub-pixel row of the plurality of first sub-pixel rows and the second sub-pixel row of the plurality of second sub-pixel rows are arranged alternately in a column direction of the sub-pixel array to form the sub-pixel array,
wherein any first sub-pixel row of the plurality of first sub-pixel rows and a second sub-pixel row adjacent to the any first sub-pixel row are offset from each other by a predetermined distance in the column direction of the sub-pixel array, and
wherein the predetermined distance is greater than zero and less than a width of the first sub-pixel, the second sub-pixel, or the third sub-pixel in a row direction.

4. The display substrate according to claim 3, wherein the predetermined distance is half of the width of the first sub-pixel, the second sub-pixel, or the third sub-pixel in the row direction.

5. The display substrate according to claim 1, wherein the first sub-pixel, the second sub-pixel, the third sub-pixel, and the white sub-pixel all present a hexagonal shape.

6. The display substrate according to claim 1, wherein a width of any sub-pixel of the first sub-pixel, the second sub-pixel, the third sub-pixel and the white sub-pixel in a row direction of the sub-pixel array is greater than or equal to a height of the any sub-pixel in the column direction of the sub-pixel array.

7. The display substrate according to claim 6, wherein a sum of a row number of the plurality of first sub-pixel rows and a row number of the plurality of second sub-pixel rows in the sub-pixel array is greater than a sum of numbers of all first sub-pixels, second sub-pixels, and third sub-pixels in each first sub-pixel row or a sum of numbers of all fourth sub-pixels and white sub-pixels in each second sub-pixel row.

8. The display substrate according to claim 1, wherein an area of the white sub-pixel is smaller than an area of any one of the first sub-pixel, the second sub-pixel, and the third sub-pixel.

9. The display substrate according to claim 2, wherein each second sub-pixel unit in the second sub-pixel row comprises one fourth sub-pixel and one white sub-pixel, and a width of the white sub-pixel in the row direction of the sub-pixel array is greater than a width of the fourth sub-pixel in the row direction of the sub-pixel array.

10. The display substrate according to claim 1, wherein the first sub-pixel, the second sub-pixel and the third sub-pixel comprise an R sub-pixel, a G sub-pixel and a B sub-pixel, respectively, such that the plurality of first sub-pixel rows form a plurality of RGB sub-pixel rows, and the fourth sub-pixel comprises a B sub-pixel such that the plurality of second sub-pixel rows form a plurality of BW sub-pixel rows.

11. The display substrate according to claim 10, wherein each B sub-pixel in any RGB sub-pixel row of the plurality of RGB sub-pixel rows is contiguous to at least one white sub-pixel in a BW sub-pixel row adjacent to the any RGB sub-pixel row, and each B sub-pixel in the adjacent BW sub-pixel row is contiguous to at least one of the R sub-pixel and the G sub-pixel in the any RGB sub-pixel row.

12. The display substrate according to claim 11, wherein each BW sub-pixel row of the plurality of BW sub-pixel rows comprises a plurality of second sub-pixel units arranged successively in the row direction of the sub-pixel array, each second sub-pixel unit comprises one B sub-pixel and two white sub-pixels, wherein one of the two white sub-pixels is between the one B sub-pixel and the other of the two white sub-pixels.

13. The display substrate according to claim 12, wherein a spacing between the two white sub-pixels is greater than a spacing between any two of the R sub-pixel, the B sub-pixel, the G sub-pixel, and the white sub-pixel.

14. The display substrate according to claim 10, wherein each RGB sub-pixel row of the plurality of RGB sub-pixel rows comprises a plurality of first sub-pixel units arranged successively in the row direction of the sub-pixel array, each first sub-pixel unit comprises one R sub-pixel, one G sub-pixel and one B sub-pixel, wherein the R sub-pixel, the G sub-pixel, and the B sub-pixel in the first sub-pixel unit are arranged successively in an RGB or a GRB order in the row direction of the sub-pixel array.

15. The display substrate according to claim 10, wherein each RGB sub-pixel row of the plurality of RGB sub-pixel rows comprises a plurality of first sub-pixel units arranged successively in the row direction of the sub-pixel array, each first sub-pixel unit comprises one R sub-pixel, one G sub-pixel and one B sub-pixel, and wherein the R sub-pixel, the G sub-pixel and the B sub-pixel in the first sub-pixel unit in a K-th RGB sub-pixel row of the plurality of RGB sub-pixel rows are arranged successively in an RGB order in the row direction of the sub-pixel array, and the R sub-pixel, the G sub-pixel and the B sub-pixel in the first sub-pixel unit in a (K+1)-th RGB sub-pixel row of the plurality of RGB sub-pixel rows are arranged successively in a GRB order in the row direction of the sub-pixel array, K being an integer greater than or equal to 1.

16. A display substrate comprising:
a base substrate; and
a display region of the base substrate comprising a sub-pixel array, the sub-pixel array comprising a plurality of first sub-pixel rows and a plurality of second sub-pixel rows, each first sub-pixel row of the plurality of first sub-pixel rows comprising a plurality of first sub-pixels, a plurality of second sub-pixels, and a plurality of third sub-pixels, each second sub-pixel row of the plurality of second sub-pixel rows comprising a plurality of fourth sub-pixels and a plurality of white sub-pixels,
wherein each first sub-pixel of the plurality of first sub-pixels, each second sub-pixel of the plurality of second sub-pixels, and each third sub-pixel of the plurality of third sub-pixels are configured such that white is capable of being presented by combining a single first sub-pixel, a single second sub-pixel, and a single third sub-pixel, and each fourth sub-pixel of the plurality of fourth sub-pixels is selected from any one of the first sub-pixel, the second sub-pixel, and the third sub-pixel, and
wherein the first sub-pixel row of the plurality of first sub-pixel rows and the second sub-pixel row of the plurality of second sub-pixel rows are arranged alternately in a column direction of the sub-pixel array to form the sub-pixel array, and,
wherein the display substrate comprises a color resist layer attached to the base substrate, the color resist layer comprises a color resist unit array, and colors of color resist units in the color resist unit array are in one-to-one correspondence with sub-pixels in the sub-pixel array.

17. The display substrate according claim 1, wherein the display substrate further comprises an electroluminescent material in each sub-pixel of the sub-pixel array, the electroluminescent material is configured to emit light of a color corresponding to the sub-pixel where it is located under an effect of an electrical signal.

18. A display panel, comprising the display substrate according to claim 1.

19. A method of displaying an image based on the display panel according to claim 18, comprising:
acquiring original grayscale values of a first primary color component, a second primary color component, and a third primary color component of each original image pixel of an original image in a three primary color space;
generating a first color component grayscale value, a second color component grayscale value, a third color component grayscale value, and a white component grayscale value corresponding to each original image pixel based on the original grayscale values of each original image pixel of the original image, so as to obtain a plurality of four-color image pixels corresponding to the image pixels of the original image respectively;
dividing the sub-pixel array of the display panel into a plurality of first sub-pixel groups and a plurality of second sub-pixel groups, each first sub-pixel group comprising one first sub-pixel, one second sub-pixel and one fourth sub-pixel contiguous to each other in a first sub-pixel row and a second sub-pixel row adjacent to each other in the sub-pixel array, each second sub-pixel group comprising one third sub-pixel and at least one white sub-pixel contiguous to each other in the first sub-pixel row and the second sub-pixel row adjacent to each other in the sub-pixel array;

making the plurality of first sub-pixel groups and the plurality of second sub-pixel groups in the sub-pixel array in one-to-one correspondence with the plurality of four-color image pixels, respectively, so as to obtain a first four-color image pixel corresponding to each first sub-pixel group and a second four-color image pixel corresponding to each second sub-pixel group;

generating a grayscale value for a fourth sub-pixel in a first sub-pixel group corresponding to the first four-color image pixel based on a third color component grayscale value in the first four-color image pixel;

generating a grayscale value for a third sub-pixel in a second sub-pixel group corresponding to the second four-color image pixel based on a third color component grayscale value in the second four-color image pixel;

generating a grayscale value for the first sub-pixel in the first sub-pixel group based on a first color component grayscale value in a first four-color image pixel corresponding to the first sub-pixel group and a first color component grayscale value in a second four-color image pixel corresponding to a second sub-pixel group adjacent to the first sub-pixel in the first sub-pixel group;

generating a grayscale value for the second sub-pixel in the first sub-pixel group based on a second color component grayscale value in a first four-color image pixel corresponding to the first sub-pixel group and a second color component grayscale value in a second four-color image pixel corresponding to a second sub-pixel group adjacent to the second sub-pixel in the first sub-pixel group; and generating a grayscale value for a white sub-pixel in the second sub-pixel group based on a white component grayscale value in a second four-color image pixel corresponding to the second sub-pixel group and a white component grayscale value in a first four-color image pixel corresponding to a first sub-pixel group adjacent to the second sub-pixel group.

20. The method according to claim 19, wherein the first sub-pixel, the second sub-pixel and the third sub-pixel comprise an R sub-pixel, a G sub-pixel and a B sub-pixel, respectively, such that the plurality of first sub-pixel rows form a plurality of RGB sub-pixel rows, the fourth sub-pixel comprises a B sub-pixel such that the plurality of second sub-pixel rows form a plurality of BW sub-pixel rows, wherein the three primary color space comprises an RGB color space, the first primary color component, the second primary color component and the third primary color component comprise a red component, a green component and a blue component, respectively, the first color component grayscale value, the second color component grayscale value and the third color component grayscale value comprise a first red component grayscale value, a first green component grayscale value and a first blue component grayscale value, respectively, the four-color image pixel comprises an RGBW image pixel, and the first four-color image pixel and the second four-color image pixel comprise a first RGBW image pixel and a second RGBW image pixel, respectively, wherein the third color component grayscale value in the first four-color image pixel comprises a first blue component grayscale value in the first RGBW image pixel, and the third color component grayscale value in the second four-color image pixel comprises a first blue component grayscale value in the second RGBW image pixel, and wherein the fourth sub-pixel in the first sub-pixel group and the third sub-pixel in the second sub-pixel group both comprise a B sub-pixel.

* * * * *